(12) United States Patent
Nilson

(10) Patent No.: US 7,668,516 B2
(45) Date of Patent: Feb. 23, 2010

(54) SYSTEMS RAMPING POWER AMPLIFIER OUTPUT POWER

(75) Inventor: Chris Nilson, San Joes, CA (US)

(73) Assignee: Broadcom Corporation, Irvine, CA (US)

(*) Notice: Subject to any disclaimer, the term of this patent is extended or adjusted under 35 U.S.C. 154(b) by 514 days.

(21) Appl. No.: 11/530,777

(22) Filed: Sep. 11, 2006

(65) Prior Publication Data

US 2007/0001767 A1    Jan. 4, 2007

Related U.S. Application Data

(62) Division of application No. 10/826,460, filed on Apr. 16, 2004, now Pat. No. 7,129,787.

(60) Provisional application No. 60/463,955, filed on Apr. 18, 2003.

(51) Int. Cl.
  *H04B 1/04*    (2006.01)
(52) U.S. Cl. .................... 455/127.1; 330/285
(58) Field of Classification Search ......... 455/126–127, 455/522, 41.1–41.2, 75, 519, 91, 115.3–115.4, 455/127.1–127.2; 330/285, 296, 311
See application file for complete search history.

(56) References Cited

U.S. PATENT DOCUMENTS

| 5,150,075 | A  | * | 9/1992  | Hietala et al. ............... 330/279 |
| 6,169,886 | B1 | * | 1/2001  | Black et al. ............... 455/127.2 |
| 6,535,065 | B2 |   | 3/2003  | Aoki |
| 6,606,308 | B1 | * | 8/2003  | Genest et al. ............... 370/318 |
| 6,639,471 | B2 |   | 10/2003 | Matsuura et al. |
| 6,759,906 | B2 |   | 7/2004  | Matsunaga et al. |
| 7,129,787 | B1 |   | 10/2006 | Nilson |

* cited by examiner

*Primary Examiner*—Robert Pascal
*Assistant Examiner*—Hieu P Nguyen
(74) *Attorney, Agent, or Firm*—Sterne, Kessler, Goldstein & Fox P.L.L.C.

(57) ABSTRACT

A power amplifier circuit including a first transistor, a second transistor, and a power control circuit. The first transistor includes a first input and a first output. The second transistor includes a second input coupled in series with the first output of the first transistor. The input circuit is coupled to the second input of the second transistor. The control circuit includes a time delay circuit and a variable source.

16 Claims, 8 Drawing Sheets

SYSTEMS RAMPING POWER AMPLIFIER OUTPUT POWER

CROSS REFERENCE TO RELATED APPLICATIONS

This application is a divisional application of U.S. patent application Ser. No. 10/826,460, filed Apr. 16, 2004, entitled "Systems and Methods for Ramping Power Amplifier Output Power, which claims priority from U.S. Provisional Patent Application No. 60/463,955 filed on Apr. 18, 2003 and entitled "Systems and Methods for Ramping Power Amplifier Output Power," which is incorporated herein by reference in its entirety.

BACKGROUND OF THE INVENTION

1. Field of the Invention

The present invention relates generally to power amplifier circuits, and more particularly, to methods and systems for controlling the output power of a power amplifier circuit.

2. Description of the Related Art

Portable transmitting devices are becoming more and more common, led first by the popularity of cellular telephones and increasingly by wireless networking products such as under the "Bluetooth" and IEEE 802.11 type (802.11) specifications. Two requirements of these types of products is a small physical size and efficient, long term (e.g., multiple days') operation relying on only battery power source. Another important requirement is that they provide minimal interference with other, similar devices that may be nearby.

Often these types of transmitters are used in very close proximity with each other and their corresponding receivers. By way of example, an 802.11 transceiver (receiver/transmitter combination) typically has a maximum range of up to about 100 meters or more to a corresponding 802.11 transceiver. However, 802.11 transceivers can also be used in very close proximity such as with only one meter or two.

Devices that contain one or more of these types of transmitters must be very power efficient. The need is driven by the low cost, small size, light weight and minimal battery capacity requirements of such competitive portable devices (e.g., cellular telephones, personal digital assistants, headsets, etc.).

Examples of areas of power efficiency gains include adjusting the output power of the transmitters. By way of example, the output power of an 802.11 transmitter needs to be adjustable for the specific conditions of use (e.g., location, proximity to corresponding receiver). Ideally, the power output should be adjustable over a selected power range and with a selected resolution. Another aspect of the power efficiency gains that are possible in portable transmitters include minimizing the power consumption such as by ensuring the transmitter circuitry is as power efficient as possible.

Wireless communication devices inherently share frequency bands and typically several devices may be transmitting simultaneously on neighboring channels. The sharing of frequency bands drives the requirement that each transmitter not interfere with other transmitters such as minimizing the emitted energy outside the selected channel. An important source of unwanted emissions is an abrupt change in output power level. When the transmitted power output abruptly transitions either upward or downward, undesirable harmonics of the selected channel frequency can be emitted. The undesirable harmonics can interfere with other channels in the frequency band. By way of example, if a transmitter is abruptly turned off (or on), undesirable harmonics can be emitted. In view of the foregoing, there is a need for systems and methods of efficiently adjusting the power output of a portable transmitter in a manner that substantially minimizes emission of undesirable harmonics.

SUMMARY OF THE INVENTION

Broadly speaking, the present invention fills these needs by providing a system and method of efficiently adjusting the power output of a portable transmitter in a manner that substantially minimizes emission of undesirable harmonics. It should be appreciated that the present invention can be implemented in numerous ways, including as a process, an apparatus, a system, computer readable media, or a device. Several inventive embodiments of the present invention are described below.

One embodiment provides a power amplifier circuit including a first transistor, a second transistor, a power control circuit and a power control circuit. The first transistor includes a first input and a first output. The second transistor includes a second input coupled in series with the first output of the first transistor. The input circuit is coupled to the first input of the first transistor. The power control circuit is coupled to the second input of the second transistor. The control circuit includes a time delay circuit and a variable source.

The variable source can include a digital input and a digital-to-analog converter. The variable source can include a variable current source. The time delay circuit can include at least one of a resistor and a capacitor. At least one of the resistor and the capacitor can be variable.

The power amplifier circuit can be included within a transmitter. The power amplifier circuit can be included within wireless data link transmitter.

Another embodiment provides a data link system that includes a first receiver a first transmitter. The first transmitter includes a power control circuit coupled to a power control input. The power control circuit includes a time delay circuit and a variable current source.

Another embodiment provides a power amplifier circuit. The power amplifier circuit includes a first transistor and a second transistor. The first transistor has a first input and a first output. The second transistor having a second input coupled in series with the first output of the first transistor. An input circuit can be coupled to the first input of the first transistor and a power control circuit can be coupled to the second input of the second transistor. The power control circuit can include an RC time delay circuit and a variable current source including a digital input and a digital-to-analog converter. At least one of the resistor and the capacitor can be variable.

Yet another embodiment provides a method of controlling power output of an amplifier. The method includes receiving a control signal. A stepped power control signal is produced. The stepped power control signal can include multiple power control steps. Producing each one of the multiple steps can include producing a step voltage and applying a time delay to the step voltage. The stepped power control signal is applied to a power control input of the amplifier.

The control signal can be a digital control signal. The digital control signal can be input to a digital-to-analog converter to produce a corresponding analog control signal. The control signal determines a number of steps included in the multiple steps.

The method can also include varying at least one aspect of the time delay to modify the time delay. At least one of the multiple steps will cause the amplifier to produce a desired output power level.

An elapsed time from a first one of the steps to a second one of steps is less than a maximum ramp time, where the second step corresponds to a desired output power level of the amplifier. A many if not most of the harmonics are substantially eliminated at each one of the steps.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION OF THE EXEMPLARY EMBODIMENTS

Several exemplary embodiments systems and methods of efficiently adjusting the power output of a portable transmitter in a manner that substantially minimizes emission of undesirable harmonics will now be described. It will be apparent to those skilled in the art that the present invention may be practiced without some or all of the specific details set forth herein.

One embodiment provides a system and method for adjusting an output power of a portable transmitter for the specific conditions of use (e.g., location, proximity to corresponding receiver). The power output can be adjustable over a selected power range and with a selected resolution. By way of example, if two transceivers are too close together, one transceiver can tell the other transceiver to reduce its power output for power equalization or even optimization over a given distance (i.e., proximity). The system and method for adjusting the output power can also be used on other types (i.e., non-portable transmitters) and can also minimize the interference with neighboring channels in the same frequency band.

Figure 1:
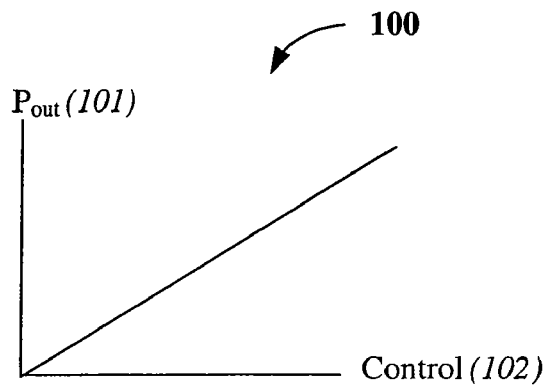
FIG. 1 shows a graph of an idealized power control result in accordance with one embodiment of the present invention.

The power adjustment system and method also is embodied in circuitry that is very power efficient. FIG. 1 shows a graph 100 of an idealized power control result in accordance with one embodiment of the present invention. The output power signal 101 and the control signal 102 are shown. The ideal output power graph 100 is linear and would therefore provide a linear selection of power output by a linear power control input. Unfortunately, such an ideal power control graph is difficult to attain.

Figure 2:
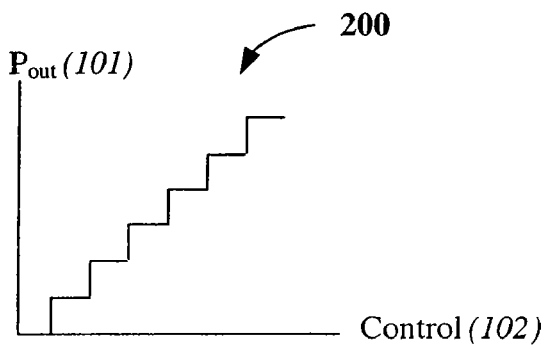
FIG. 2 shows a graph of an output power step, in accordance with one embodiment of the present invention.

FIG. 2 shows a graph 200 of an output power step, in accordance with one embodiment of the present invention. The graph 200 shows the output power increasing in substantially uniform increments or steps. Such an output power graph 200 would be very useful as a control input could select one of the well-defined steps in output power that matches a desired output power level. In this manner the desired output power could be easily selected. Varying the output of the transmitter power amplifier (PA), can allow the PA to generate just the power needed instead of generating the maximum PA output power and then discarding the excess power at the antenna.

For a given amplifier circuit, there are many ways to control output power. One approach is to use an attenuator. When an attenuator is used, the amplifier is operated at a maximum output power (or at least a constant high output power level that is equal to or higher than a maximum desired output power). The maximum output power is passed through a controlled loss device or circuit (i.e., an attenuator) to produce the desired output power level, at somewhat less than maximum output power, at the antenna. Unfortunately the attenuated output power amplifier circuit consumes energy from the power supply at the same level necessary for maximum output and therefore is not very efficient use of a limited power source (e.g., a battery). An attenuated output power amplifier circuit also requires the additional attenuator circuit components that can be relatively expensive.

Another approach to control the output power is to vary the power that is supplied to the power amplifier (PA). A variable power supply can be used to provide biasing power to the PA. One disadvantage of a variable power supply is that the control range is relatively small. Further, many PA circuits are very inefficient if not biased at the optimum levels. By way of example, a linear amplifier is very difficult to operate in this manner. Yet another problem with using a variable power supply to control the output power is that the power supply cannot be quickly varied so as to increase and decrease the output power quickly.

Yet another approach is to vary the input signal that is being amplified. If the input signal to the PA is smaller, and the PA is a linear amplifier, then the resulting output is also smaller. Unfortunately, it is typically very difficult to accurately control the amplitude of the input signal. Further, varying the amplitude of the input signal is slow. Further still, the circuitry required to implement varying the amplitude of the input signal can consume a relatively large quantity of energy, especially at the higher power levels. As a result, much if not all of the power efficiency gains by the power amplifier are consumed by the circuitry required to implement varying the amplitude of the input signal. Varying the amplitude of the input signal also provides a relatively narrow power control range.

Figure 3:
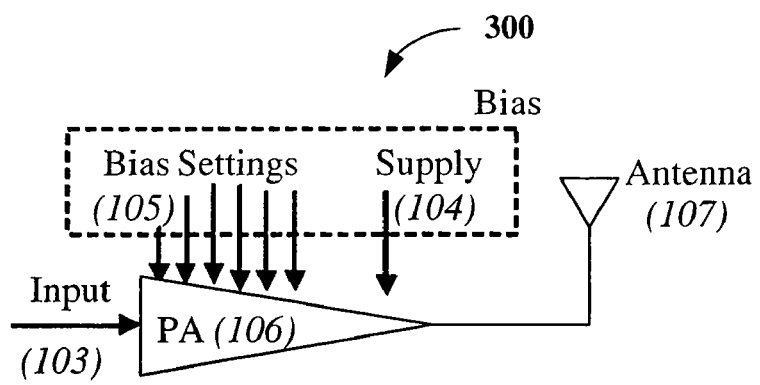
FIG. 3 describes a circuit for using bias to vary the amplifier, in accordance with one embodiment of the present invention.

Still another approach is to pull bias to vary the PA. A pull bias circuit is easier to implement, fast (timely), works with non-linear amplifiers, and is also power efficient. FIG. 3 describes a circuit 300 for using bias to vary the amplifier, in accordance with one embodiment of the present invention. The PA 106 has multiple input nodes. The input signal 103 is applied to an input signal node of the PA 106. Power 104 from a power supply (not shown) is applied to a power node on the PA 106. The PA 106 also includes multiple bias nodes through which the bias power is supplied to the PA. The bias settings 105 on each of the bias nodes can be adjusted to control the power output of the PA 106. Control aspects of the bias settings 105 can be grouped together with control aspects of the power supply 104 to affect the PA output. This grouping can be referred to as "bias" for the foregoing description. By controlling both the bias settings and the power supply, the output power can be efficiently controlled. PA output flows to the antenna 107.

Figure 4:
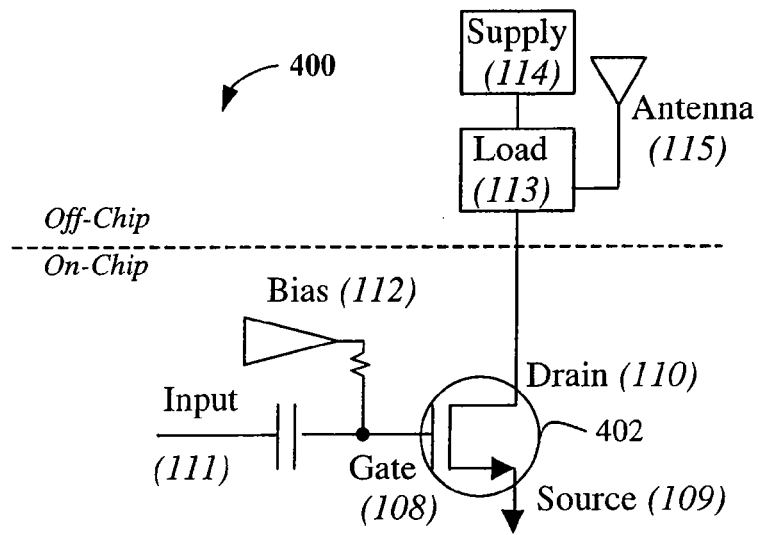
FIG. 4 is a schematic diagram of a PA circuit, in accordance with one embodiment of the present invention.

FIG. 4 is a schematic diagram of a PA circuit 400, in accordance with one embodiment of the present invention. The most common RF power amplifier in CMOS technology is the single AC coupled transistor 402 with some DC circuit to set the gate voltage 108. The transistor source is 109 while the transistor drain is 110. Input signal 111 can be a relatively high-frequency signal. The PA bias 112 is set to a bias level that determines the class of operation of the transistor 402. The transistor 402 amplifies the input signal 111 to create an output current that is proportional to the input signal. The output signal can be coupled to an "off chip" load 113. The load 113 can include the antenna 115. The circuit 400 can also include some passive components on the circuit and the DC supply 114. The PA circuit 400 can maximize the amount of energy that goes out of the antenna 115 and minimize the amount of energy dissipated in the amplifier circuit.

Figure 5:
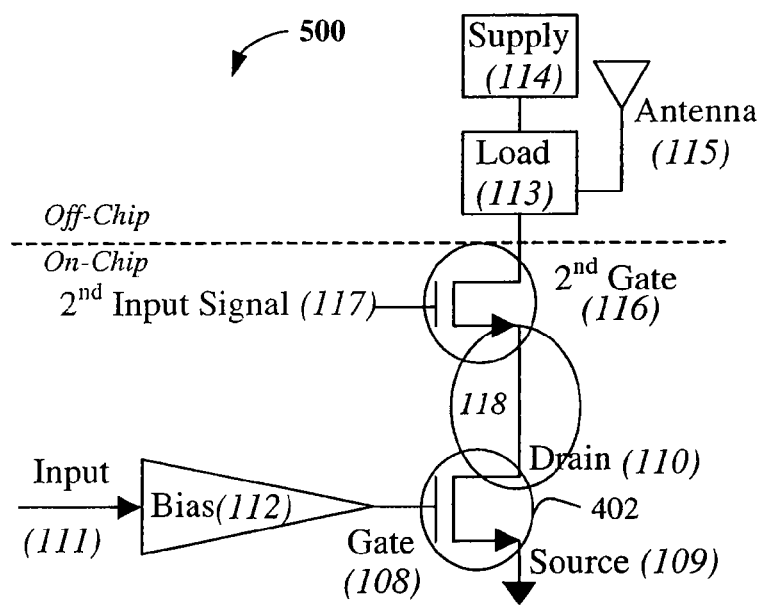
FIG. 5 is a schematic of an amplifier circuit, in accordance with one embodiment of the present invention.
Figures 6A, 6B:
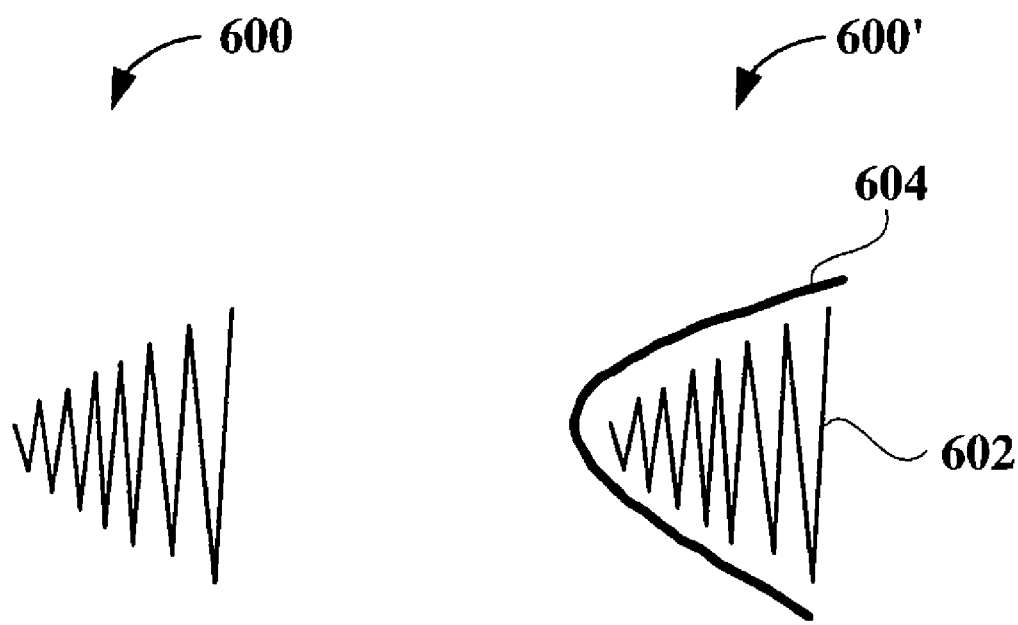
FIG. 6A shows a quickly varying signal that is proportional to the first input signal in FIG. 5, in accordance with one embodiment of the present invention.
FIG. 6B shows the envelope that is controlled by the second input signal in FIG. 5, in accordance with one embodiment of the present invention.

FIG. 5 is a schematic of an amplifier circuit 500, in accordance with one embodiment of the present invention. The amplifier circuit 500 is substantially similar to the amplifier circuit 400 except a second transistor 116 is connected in series, between transistor 402 and the load. The second transistor 116 provides another node (i.e., the gate of the second transistor 116) into which variations can be added to the operations of the circuit 500. A second input signal 117 can be applied to the gate of the second transistor 116. The second input signal 117 can be relatively slowly varying signal. This second input signal 117 is referred to as the output power control signal. The output power control signal controls the envelope of RF energy between transistors (e.g., shaded ellipse 118). By way of example, FIG. 6A shows a quickly varying signal that is proportional to the first input signal 111 in FIG. 5, in accordance with one embodiment of the present invention. FIG. 6B shows the envelope that is controlled by the second input signal 117 in FIG. 5, in accordance with one embodiment of the present invention.

Figure 7:
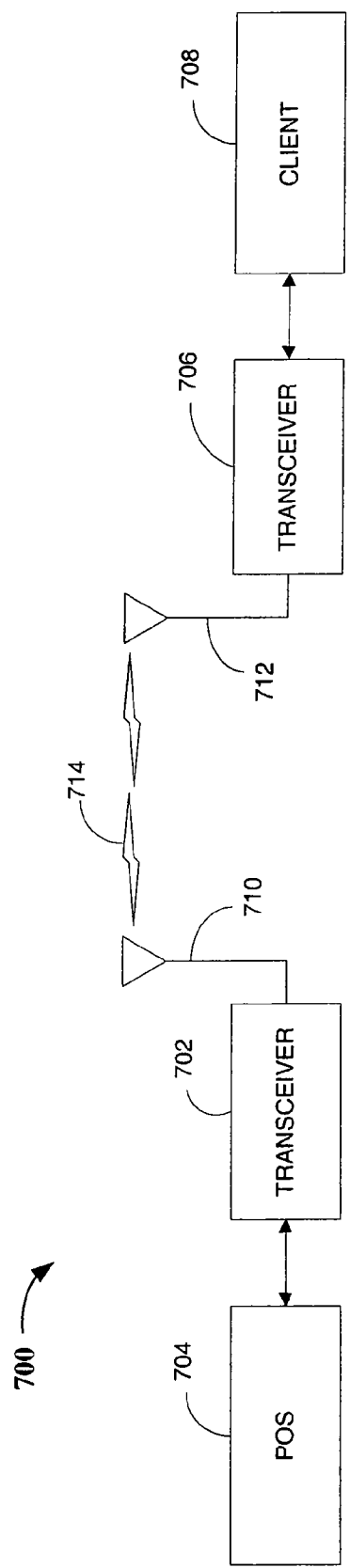
FIG. 7 shows a wireless data link, in accordance with one embodiment of the present invention.

FIG. 7 shows a wireless data link 700, in accordance with one embodiment of the present invention. The wireless data link 700 can be any type of wireless protocol (i.e., Bluetooth and 802.11 et seq.). The wireless data link 700 includes a serving transceiver 702 that connects to a point of service 704 (e.g., a network access provider, server). The wireless data link 700 also includes a client transceiver 706 that connects to a client 708. Both the serving transceiver 702 and the client transceiver 706 have respective antennas 710 and 712. The data signal 714 is transmitted between the antennas 710 and 712.

Figure 8:
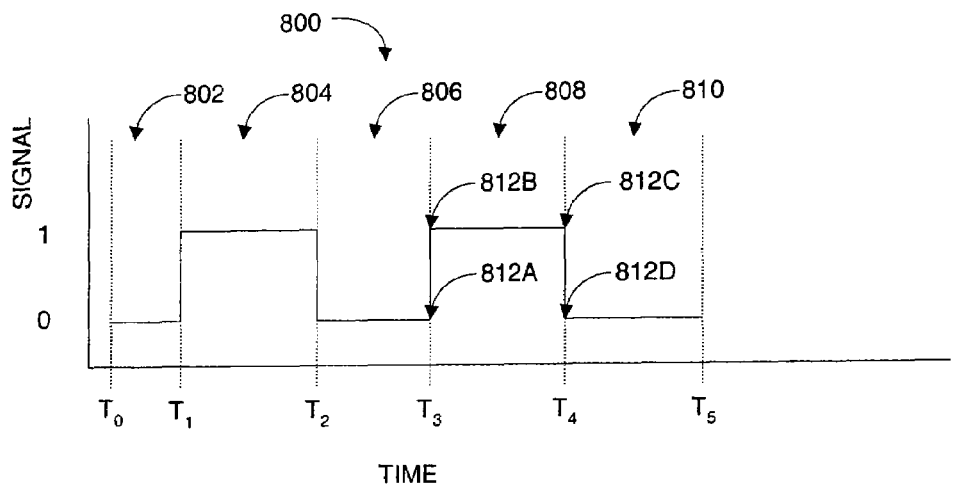
FIG. 8 is a graph of a receive and transmit timing sequence, in accordance with one embodiment of the present invention.

The transceivers 702 and 706 can support a simplex data transmission and receive session on a single channel (i.e., single frequency) from the band of channels that the transceivers 702 and 706 can use. The single channel is shared by the transceivers 702 and 706 by dividing the channel by time. FIG. 8 is a graph of a receive and transmit timing sequence 800, in accordance with one embodiment of the present invention. An initial time slot 802 occurs between a starting time t0 and a time t1 when the receive time slot 804 begins. The receive time slot 804 ends at a time t2. An interim time slot 806 begins at time t2 and ends at time t3, when the transmit time slot 808 begins. The transmit time slot 808 ends at time t4, when a final time slot begins. The timing sequence 800 ends at a time t5. The timing sequence 800 is used by a first one of the transceivers 702 or 706 while a second timing sequence is used by the second one of the transceivers. The second timing sequence has the receive and transmit time slots 804 and 808 swapped so that the first transceiver can will be in the receive time slot 804 while the second transceiver was in the transmit time slot 808. In this way the first transceiver can receive at the same time that the second transceiver is transmitting.

When the transceiver 702 starts transmitting, the PA output power must ramp to the maximum PA power output in as short of a time as possible. In a timing-ideal operation the ramp would be substantially vertical (i.e., a square wave) as shown in transmit time slot 808. However, as described above, the wireless networking systems must minimize interference with neighboring channels. When the PA output power is increased or decreased at a sharp transition (i.e., transition points 812A-812D), then unwanted harmonics of the transmitted frequency are also produced. By way of example, a 2.4 GHz transmit signal would generate unwanted harmonics at 2.4, 7.2, and 9.6 GHz among others. These harmonics can interfere with the input signal and other data link channels. The unwanted harmonics can be controlled by ramping the PA output power between the minimum and the maximum PA output power.

Figure 9:
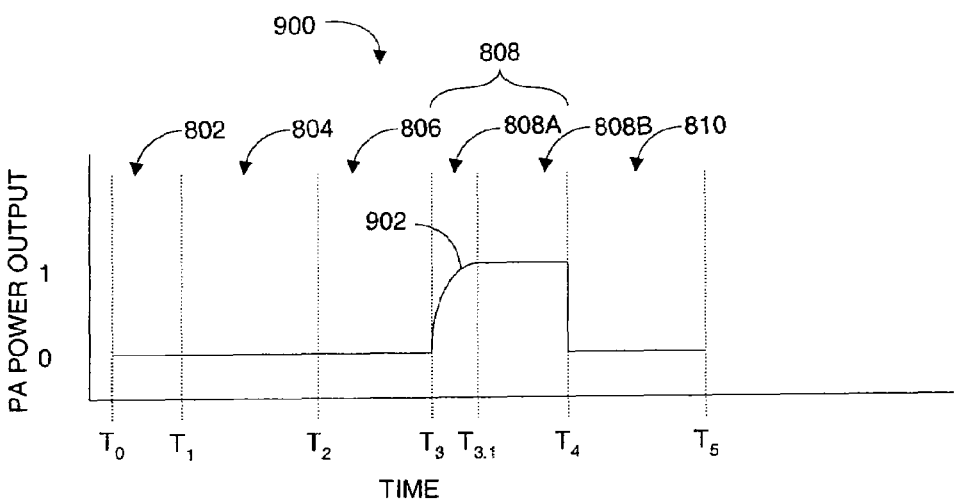
FIG. 9 is a graph of a PA output power pulse during a transmit time slot, in accordance with one embodiment of the present invention.

FIG. 9 is a graph of a PA output power pulse 900 during a transmit time slot 808, in accordance with one embodiment of the present invention. The envelope of the PA output power pulse 900 can be controlled by the second input signal 117 of FIG. 6 applied to the gate of the second transistor 116. The envelope can be used to control the shape of the PA output power pulse during the transmit time slot 808. By way of example, the envelope can be used to form the curved ramp 902 between time t3 and time t3.1.

The second input signal 117 of FIG. 6 consumes no additional current because, in a MOS circuit, there is no current flowing into the gate of a MOS transistor (i.e., MOS transistor 116). Therefore an envelope signal can be input that rises and falls slowly. By way of example, from 0 to the supply voltage 1 in one microsecond (1 l.ts). Even this relatively slow speed can be too fast to implement by the power supply voltage 114.

However, the 1 µs speed can be relatively easy to implement on-chip at the second transistor 116 because that is a low-power circuit.

Referring to FIGS. 7 and 9, the serving transceiver 702 will be transmitting the data to the client transceiver 706 during the transmit time slot 808. The data is modulated into the PA output power pulse 900. Coinciding with the transmit time slot 808, the client transceiver 706 has a receive time slot. As a result, the ramp 902 should rise quickly enough (i.e., the time between t3 and t3.1 is short enough) so that the required PA output power is at the desired level and the resulting transmitted signal from the antenna is also at the desired level so that transceiver 706 can receive the data being transmitted during the receive time slot.

Figure 10:
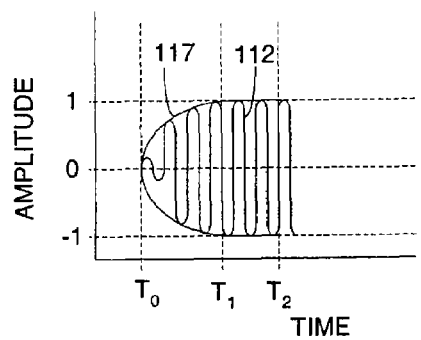
FIG. 10 is a graphical representation of the input signals, in accordance with one embodiment of the present invention.

Both inputs 117, 112 can arise simultaneously and, essentially, get multiplied together. Therefore, the second input signal 117 can control the shape of the envelope of the PA output power. FIG. 10 is a graphical representation of the input signals 117, 112, in accordance with one embodiment of the present invention. The time base of the two input signals 117, 112 are different. The first input signal 112 has a time base of, for example, less than about one nanosecond (i.e., a frequency of 1 GHz) and the second input signal 117 has a time base of, for example, less than about one microsecond (i.e., a frequency of 1 MHz). Stated in another form, the envelope can be adjusted at a frequency of about 1 MHz where the second input signal is the data and carrier signals being transmitted and can be several gigahertz (GHz) such as about 2.4 GHz or even higher.

The second input 117 can control or select an amplitude of the PA output power. A power level of 1 and −1 represents the desired output power level. The power is proportional to the amplitude of the signal output from the PA. When the amplitude is 0, no power is output to the antenna. When the amplitude is partially to 1 (or −1, i.e., between time t0 and time t1), only a portion of the possible power is applied to the antenna. The rate of rise of the amplitude PA output power can be controlled. Further, discrete stopping points along the envelope can also be controlled. As a result, for any specified period of time, a selected portion of the output power capability can be output. This can be very useful if two transceivers are very close and the full output power is not required to communicate between the two transceivers. This system allows controlling the envelope in a way that does not consume excess power. Further, the described system does not significantly change the existing topology. An additional advantage is that a more efficient choice of transistors can be used than if only had one transistor was in the circuit.

Figure 11:
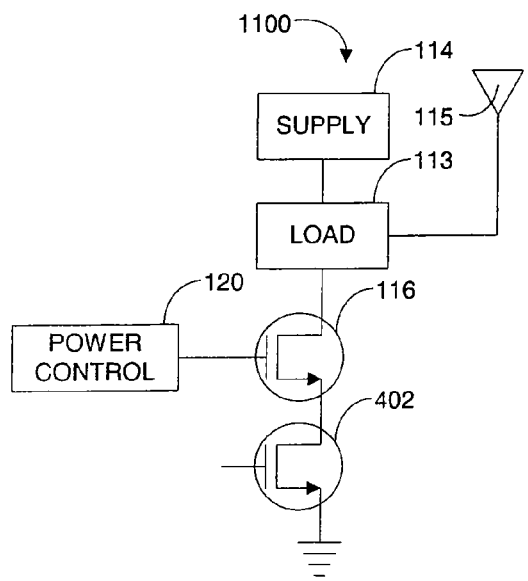
FIG. 11 is a schematic of a two transistor power amplifier circuit, in accordance with one embodiment of the present invention.
Figure 12:
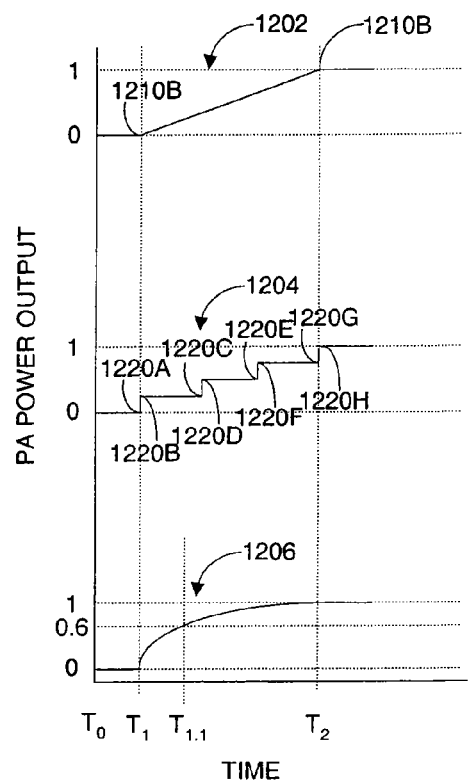
FIG. 12 shows three ramp shapes, in accordance with one embodiment of the present invention.

FIG. 11 is a schematic of a two transistor power amplifier circuit 1100, in accordance with one embodiment of the present invention. The power control block 120 applies an input signal to the gate of the second transistor 116. The shape of the increase from zero to the desired power output is called a ramp or ramp shape. FIG. 12 shows three ramp shapes, in accordance with one embodiment of the present invention. The ramp shapes are a linear ramp 1202, a step ramp 1204, and an exponential ramp 1206. The linear ramp 1202 has two sharp transition points 1210A and 1210B. When an amplitude of a signal changes rapidly (i.e., at the sharp transition points 1210A, 1210B), undesirable harmonics can be generated. The step ramp 1204 has many sharp transition points 1220A-H and therefore can generate many undesirable harmonics.

The exponential ramp 1206 has a relatively smooth shape (i.e., without any sharp transition points) and therefore will cause few if any undesirable harmonics to be generated. However, the exponential ramp 1206 can ramp up too quickly for a first portion (i.e., between time t0 and time t1) and ramp up too slowly as the amplitude approaches the desired amplitude level (i.e., between time t1 and time t2). As result the total transition time from minimum amplitude to the desired amplitude (i.e., from time t0 to time t2) can be excessively long.

Figure 13:
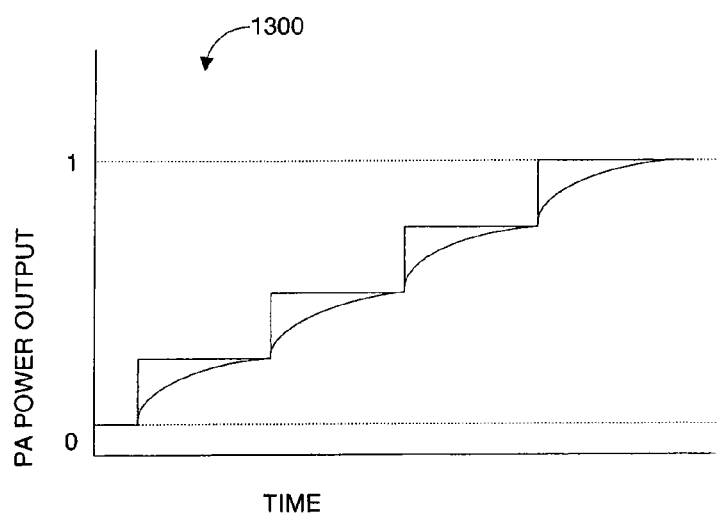
FIG. 13 shows a combination ramp signal, in accordance with one embodiment of present invention.

FIG. 13 shows a combination ramp signal 1300, in accordance with one embodiment of present invention. The combination ramp signal 1300 combines the best of the ramp shapes 1202, 1204 and 1206. In one embodiment, the second transistor allows multiple steps (e.g., three steps). However, in place of the undesirable sharp edges 1220B, 1220D, 1220F, 1220H, an exponential curve is inserted on each step. It should be understood that more than three steps could also be used. By way of example four, five, six, eight, sixteen or even thirty-two steps or more could be used. In one embodiment, each step is a fixed change in amplitude (e.g., 2 db) such that the signal could be stepped from zero to a maximum signal level (e.g., +30 db) in defined stepped increases. It should be understood that each step could also be a different change in amplitude and/or a different duration in time.

The combination ramp signal 1300 provides a rapid overall rate of rise to adjust the output power signal from a minimum level to a maximum desired level within a desired timeframe (i.e., between time t3 and time t3.1 as described above in FIG. 9) while substantially eliminating harmonics. As result, any undesirable harmonic energy out of the antenna is minimized. By way of example, Bluetooth is often used as a data link between two devices (e.g., a PDA and a desktop computer). Because the Bluetooth link is a data link, it is important that each Bluetooth transceiver generate an output signal at the required amplitude very quickly so as to not violate Bluetooth timing requirements or otherwise unduly delay the data transfer.

Figure 14:
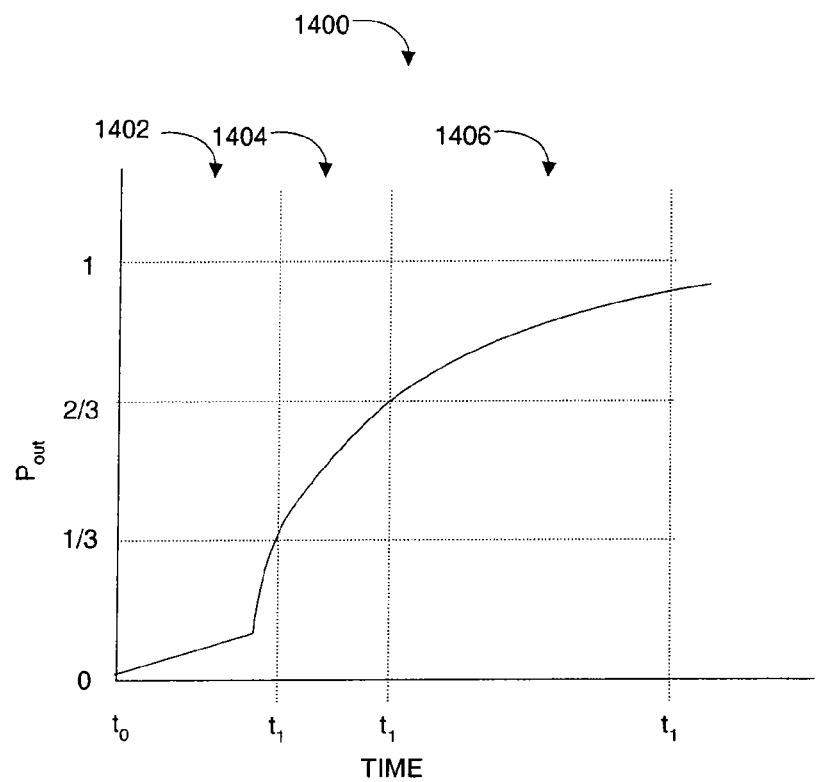
FIG. 14 shows a transfer function curve of a selected transistor, in accordance with one embodiment of the present invention.

Additionally, the rate is appropriate (i.e., more constant). When the curve of a given amplifier's output is measured in relation to the gate, the resultant transfer function curve is a characteristic of the device. The transfer function curve is not linear and if an efficient circuit is needed, the shape of the transfer function curve must be adapted. FIG. 14 shows a transfer function curve 1400 of a selected transistor, in accordance with one embodiment of the present invention. The transfer function curve 1400 is a graph of the relationship of Pout and Pgate of transistor 116. Because the transfer function curve 1400 is not linear, it can be difficult to traverse the transfer function curve 1400 in three equal steps.

The transfer function curve 1400 is shown divided into three, uneven steps. A first step 1402, between time t0 and time t1, the transfer function curve 1400 rises in amplitude a first one-third of the desired amplitude (represented by a "1"). A second step 1404, between time t1 and time t2, the transfer function curve 1400 rises in amplitude a second one-third of the desired amplitude. A third step 1406, between time t2 and time t3, the transfer function curve 1400 rises in amplitude a third one-third of the desired amplitude. The duration of each of the steps 1402-1406 are different.

To increase predictability and linearity of the PA output power ramping, the transfer function curve 1400 can be divided into more segments in time (i.e., increase the resolution in time). Dividing the transfer function curve 1400 into more time segments can allow the resulting ramp shape to more closely approximate desire ramp shape such as shown in FIG. 13 above. Adding a time constant to limit the rate at which the steps can be taken can also aid in optimizing the ramp shape. In other words, to add flexibility in the circuit, both the duration of each step in the ramp and the height of each step can be adjusted based on the shape transfer function curve.

Figure 15:
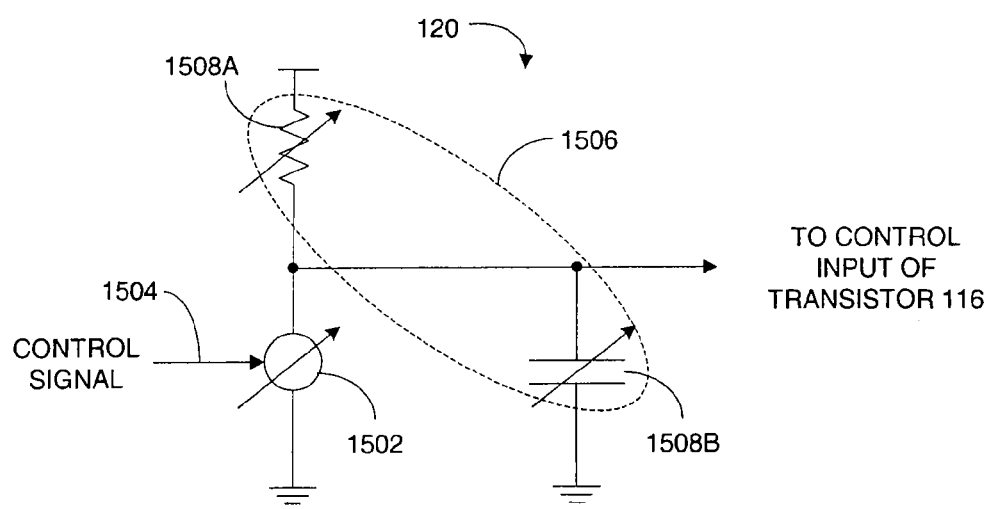
FIG. 15 shows a schematic of the power control block, in accordance with one embodiment of the present invention.

Controlling the duration and the height of each step in the ramp can be accomplished with a digital control to the PA amplifier circuit. The digital control can also add programmability into the circuit. FIG. 15 shows a schematic of the power control block 120, in accordance with one embodiment of the present invention. The power control block 120 includes a digitally controlled variable source 1502. The digitally controlled variable source 1502 can include a variable current source or a variable voltage source or a combination thereof. The digitally controlled variable source 1502 can include a digital-to-analog converter (DAC) that can receive a digital control word on the digital control line 1504. The DAC can convert the digital control word to an analog current level or voltage level such as in a finite number of steps from a minimum current to a maximum current.

The power control block 120 also includes a series RC network 1506 formed by resistor 1508A and capacitor 1508B. The RC network 1506 provides a time constant that can limit the rate of change in each step that the digitally controlled variable current source 1502 outputs.

Figure 16:
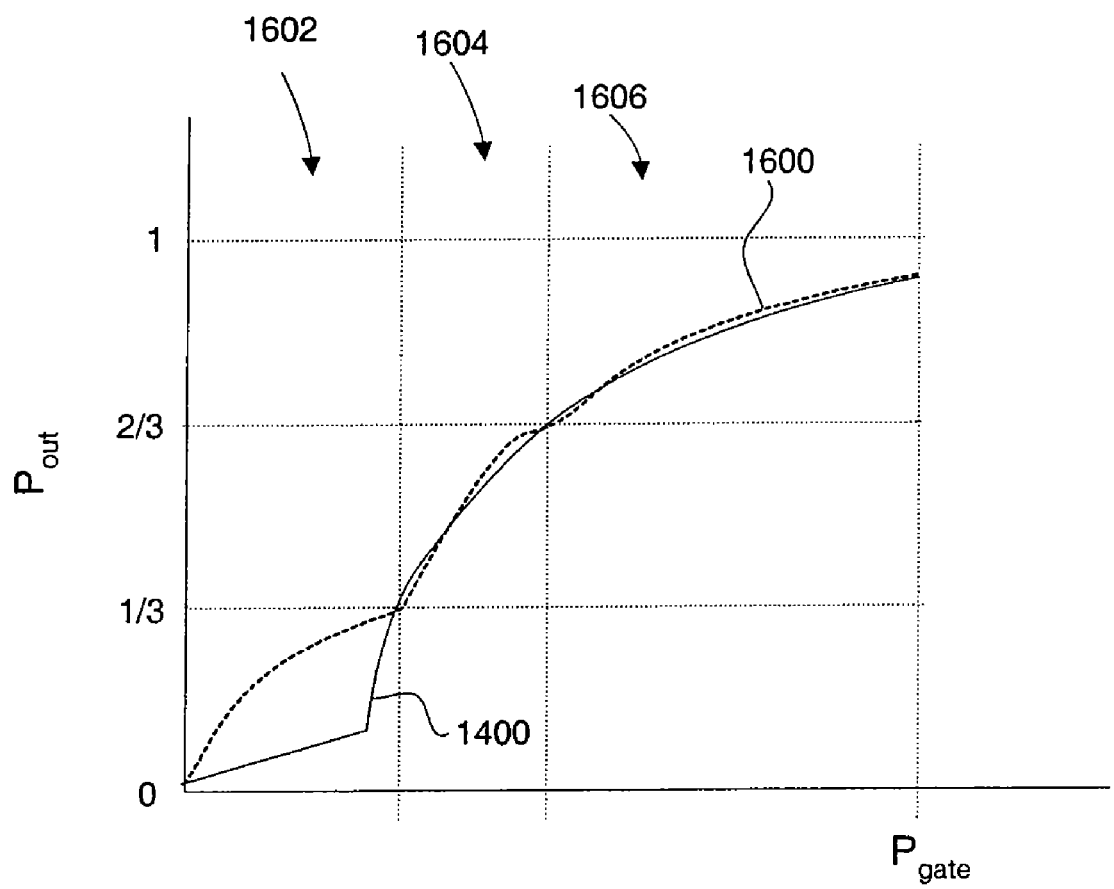
FIG. 16 is a graph of a control voltage curve output from the power control block, in accordance with one embodiment of the present invention.

FIG. 16 is a graph of a control voltage curve 1600 output from the power control block 120, in accordance with one embodiment of the present invention. The control voltage curve 1600 is shown compared to the transfer function curve 1400. While the voltage curve 1600 is substantially similar to a follows the transfer function curve 1400, the voltage curve 1600 has somewhat smooth steps 1602-1606 that also approximate the desired curved steps described in FIG. 13 above.

Each of the steps 1602-1604 are limited by the time constant so that the curve of each step does not occur too quickly. Further, each of the steps 1602-1604 has approximately the same exponential curve. By way of example, an initial control voltage output from the power control circuit 120 initiates the first step 1602. The first step has the desired curved shape due in part to the RC time constant. When the first step 1602 achieves the desired portion of the desired voltage level (i.e., ⅓ of the desired voltage level), a second voltage can be output from the power control circuit 120. The second voltage initiates the second step 1604. When the second step 1604 achieves the desired portion of the desired voltage level (i.e., ⅔ of the desired voltage level), a third voltage can be output from the power control circuit 120. The third voltage initiates the third step 1606. The third step 1606 can implement a larger voltage but over a longer period of time. It should be understood that three steps are shown as a simplified example and that more than three steps could be included such as sixteen or even thirty-two steps.

These programmable parameters can be achieved by taking the current through the resistor 125, which results in a specific voltage. The desired specific exponential shape can be implemented by adding a capacitor 126 to the circuit. The resulting exponential shape of the curve of each step 1602-1606 is a function of the values of the resistor 1508A and the capacitor 1508B. A fixed resistor value and a fixed capacitor value can be selected to determine the tau (t) (i.e., the product of R and C). 't provides the exponential shape of the curve. RC='r can describe how quickly the exponential rises.

One embodiment of the present invention takes a current into a DAC (digital to analog converter) to put voltage steps on a certain node with programmable time and amplitude. In one embodiment, the DAC can receive a digital signal and produce a corresponding analog output. By way of example, if the DAC receives a 5-bit digital control word signal then the DAC could produce any of thirty-two different steps. Similarly, with a 6-bit digital control word signal then the DAC could produce any of sixty-four different steps.

In addition, a fixed time constant can be used for control along with those components. In one embodiment, the time constant control can be fixed, alternatively the time constant control can be variable if one or both of the resistor 1508A and capacitor 1508B are variable. Making the time constant control programmable/variable, could yet add another aspect of adjustability and control into the circuit.

Several significant advantages can be achieved. By way of example simultaneous time and amplitude control can be achieved. A relatively large range in power output is provided. Further very fine resolution can also be achieved. These controls provide the ability to optimize the circuit flow, increase the power control range and increase circuit efficiency. The output power transfer from the amplifier to the antenna output can also be optimized. Maximum power transfer is achieved while reducing unwanted harmonics. This allows for easy implementation of power control over a specific power range and within a certain resolution (maximum step size). Power consumption is kept as low as possible while the circuitry is as efficient as possible. An exact shape and speed at the start of a transmission can be achieved and no attenuator is needed before the antenna.

As used herein in connection with the description of the invention, the term "about" means +/−10%. By way of example, the phrase "about 16" indicates a range of between 14 and 18. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the described herein.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A data link system, comprising:
a first transceiver including a first transmitter, the first transmitter being configured to transmit a first data transmission at a power output level, the first transmitter including:
a power control circuit configured to increase the power output level over time from substantially zero using an envelope signal, the envelope signal being a product of at least two of a group consisting of: a linear ramp, a step ramp, and an exponential ramp signal.

2. The data link system of claim 1, wherein the first transmitter is configured to transmit the first data transmission at the power output level to a first receiver.

3. The data link system of claim 1, wherein the first transmitter is configured to transmit the first data transmission over a wireless data link.

4. The data link system of claim 3, wherein the first transmitter is configured to transmit the first data transmission over a single channel of the wireless data link, the single channel of the wireless data link being from a plurality of channels that are useable by the first transceiver.

5. The data link of claim 1, wherein the first transmitter is configured to transmit the first data transmission in accordance with a communication protocol.

6. The data link system of claim 5, wherein the communication protocol is one of a group consisting of:
a Bluetooth specification; and
an IEEE 802.11 specification.

7. The data link system of claim 1, wherein the first transmitter is configured to transmit the first data transmission during a first time slot of a plurality of time slots.

8. The data link system of claim 1, wherein the first transceiver further includes a first receiver, the first receiver being configured to receive a second data transmission.

9. The data link system of claim 8, wherein the first receiver is configured to receive the second data transmission from a second transmitter.

10. The data link of claim 8, wherein the first receiver is configured to receive the second data transmission over a wireless data link.

11. The data link system of claim 10, wherein the first receiver is configured to receive the second data transmission over a single channel of the wireless data link, the single channel of the wireless data link being from a plurality of channels that are useable by the first transceiver.

12. The data link system of claim 8, wherein the first receiver is configured to receive the first data transmission in accordance with a communication protocol.

13. The data link system of claim 12, wherein the communication protocol is one of a group consisting of:
a Bluetooth specification; and
an IEEE 802.11 specification.

14. The data link system of claim 8, wherein the first receiver is configured to receiver the second data transmission during a first time slot of a plurality of time slots.

15. The data link system of claim 1, wherein the power control circuit is configured to increase the desired power output level before transmitting the first data transmission.

16. The data link system of claim 1, wherein the step ramp signal includes at least three steps.

* * * * *

UNITED STATES PATENT AND TRADEMARK OFFICE
CERTIFICATE OF CORRECTION

PATENT NO. : 7,668,516 B2
APPLICATION NO. : 11/530777
DATED : February 23, 2010
INVENTOR(S) : Chris Nilson It is certified that error appears in the above-identified patent and that said Letters Patent is hereby corrected as shown below:

In the Title Page, Item (54), please replace "Systems Ramping Power Amplifier Output Power" with --Systems for Ramping Power Amplifier Output Power--.

On the Title Page:

The first or sole Notice should read --

Subject to any disclaimer, the term of this patent is extended or adjusted under 35 U.S.C. 154(b) by 679 days.

Signed and Sealed this

Twenty-first Day of September, 2010

David J. Kappos
*Director of the United States Patent and Trademark Office*

UNITED STATES PATENT AND TRADEMARK OFFICE
CERTIFICATE OF CORRECTION

PATENT NO. : 7,668,516 B2  Page 1 of 1
APPLICATION NO. : 11/530777
DATED : February 23, 2010
INVENTOR(S) : Chris Nilson It is certified that error appears in the above-identified patent and that said Letters Patent is hereby corrected as shown below:

In the Title Page, Item (54) and at Column 1, lines 1 and 2, the title, please replace "Systems Ramping Power Amplifier Output Power" with --Systems for Ramping Power Amplifier Output Power--.

On the Title Page:

The first or sole Notice should read --

Subject to any disclaimer, the term of this patent is extended or adjusted under 35 U.S.C. 154(b) by 679 days.

This certificate supersedes the Certificate of Correction issued September 21, 2010.

Signed and Sealed this

Nineteenth Day of October, 2010

David J. Kappos
*Director of the United States Patent and Trademark Office*